United States Patent
D'Arcy et al.

(10) Patent No.: US 7,206,994 B2
(45) Date of Patent: Apr. 17, 2007

(54) CHECKSUM CALCULATOR WITH TREE STRUCTURE OF REDUCTION STAGES

(75) Inventors: Paul G. D'Arcy, Chelmsford, MA (US); Kerry D. Snyder, Orefield, PA (US); Jesse Thilo, Bethlehem, PA (US); Kent E. Wires, Mine Hill, NJ (US); Vitaly A. Zelov, Riegelsville, PA (US)

(73) Assignee: Agere Systems Inc., Allentown, PA (US)

( * ) Notice: Subject to any disclaimer, the term of this patent is extended or adjusted under 35 U.S.C. 154(b) by 493 days.

(21) Appl. No.: 10/697,717

(22) Filed: Oct. 30, 2003

(65) Prior Publication Data

US 2005/0097433 A1 May 5, 2005

(51) Int. Cl.
*G06F 11/10* (2006.01)
*H03M 13/00* (2006.01)

(52) U.S. Cl. .................. 714/807; 714/758; 714/781

(58) Field of Classification Search ............... 714/807, 714/758, 776, 781
See application file for complete search history.

(56) References Cited

U.S. PATENT DOCUMENTS

| | | | | |
|---|---|---|---|---|
| 6,324,670 | B1 * | 11/2001 | Henriksen | 714/807 |
| 6,412,092 | B1 * | 6/2002 | Raghunath | 714/807 |
| 6,591,397 | B1 * | 7/2003 | Henriksen | 714/807 |
| 6,643,821 | B2 * | 11/2003 | Karim et al. | 714/801 |
| 6,964,008 | B1 * | 11/2005 | Van Meter, III | 714/807 |
| 6,968,498 | B1 * | 11/2005 | Pal | 714/807 |

* cited by examiner

*Primary Examiner*—Albert Decady
*Assistant Examiner*—Esaw Abraham (57) ABSTRACT

A checksum calculator employs a tree structure of reduction stages to process words of a checksum data array. The number of words in the checksum data array is compared to the number of words each of the reduction stages might process. If the number of words in the checksum data array is greater than the number of words that the highest level reduction stage might process, then a portion of the checksum data array is processed, remaining words of the checksum data array are appended to the processed portion, and the process is repeated. If the number of words in the checksum data array is less than or equal to the number of words that the highest level reduction stage might process, then the checksum data array is processed by the lowest level reduction stage that can process the entire checksum data array.

16 Claims, 5 Drawing Sheets

| INPUTS | OUTPUTS | |
|---|---|---|
| c,a,b | c_out | sum |
| 0,0,0 | 0 | 0 |
| 0,0,1 | 0 | 1 |
| 0,1,0 | 0 | 1 |
| 0,1,1 | 1 | 0 |
| 1,0,0 | 0 | 1 |
| 1,0,1 | 1 | 0 |
| 1,1,0 | 1 | 0 |
| 1,1,1 | 1 | 1 |

CHECKSUM CALCULATOR WITH TREE STRUCTURE OF REDUCTION STAGES

CROSS-REFERENCE TO RELATED APPLICATIONS

This application is related to U.S. patent application Ser. No. 10/619,908 filed Jul. 15, 2003, the teachings of which are incorporated herein by reference.

BACKGROUND OF THE INVENTION

1. Field of the Invention

The present invention relates to communication networks, and, more particularly, to calculation of a checksum value for a packet of data.

2. Description of the Related Art

As packet-based networks are increasingly utilized for communication, network traffic throughput speeds are also increased. Modules designed to route packets must process packets at increasingly higher speeds to achieve these higher network traffic throughput speeds. In particular, many of the common arithmetic operations are performed at higher speeds. One such arithmetic operation is calculation of the checksum for a packet to identify a corrupt packet.

Many network protocols detect corrupt packets by including a checksum that applies to a specific portion of the packet. Typically, the checksum is included in a header of the packet. A receiver calculates the checksum of the packet, compares it to the checksum included in the packet's header, and declares a corrupt packet if the two values do not match. The checksum may be calculated in many ways. One method employed in many packet networks partitions a portion of the packet (the "subpacket" that generally includes the data but not the header and start/end flags) into L-bit unsigned words. The L-bit unsigned words are added together using one's-complement addition, and then the checksum is set as the one's-complement of the result. If the number of bits in the subpacket is not an integer multiple of the L-bit word size, the final L-bit word comprises the remaining subpacket byte's bits as the most significant bits (MSBs) and zero padding for the remaining bits (the least significant bits, or LSBs).

SUMMARY OF THE INVENTION

The present invention relates to a checksum calculator that employs a tree structure of reduction stages to process segments of a checksum data array. The number of segments in the checksum data array is compared to the number of segments that each of the reduction stages might process. If the number of segments in the checksum data array is greater than the number of segments that the highest level reduction stage might process, then a portion of the checksum data array is processed, remaining segments of the checksum data array are appended to the processed portion, and the process is repeated. If the number of words in the checksum data array is less than or equal to the number of segments that the highest level reduction stage might process, then the checksum data array is processed by the lowest level reduction stage that can process the entire checksum data array. Once the entire checksum data array has been processed by at least one reduction stage, the tree structure continues to process the checksum data array until the checksum is calculated.

In accordance with exemplary embodiments of the present invention, a checksum is calculated for a data block by reduction. The checksum is calculated by (a) partitioning the data block into N segments of a data matrix, N an integer greater than one; and (b) comparing N to a number of segments processed by each of at least two reduction stages, the at least two reduction stages arranged in a tree structure. If N is less than or equal to the number of segments processed by a highest level reduction stage, then: (1) the data matrix is processed with the lowest level reduction stage that can process the entire data matrix to generate a new data matrix; and (2) step (1) is repeated for each subsequent new data matrix until two data segments remain. Otherwise, if N is greater than the number of segments processed by the highest-level reduction stage, then: (3) the data matrix is divided into one or more portions; (4) one matrix portions are processed with the highest-level reduction stage that can process the matrix portion to generate a new data matrix; (5) steps (1) and (2) are repeated for each subsequent new data matrix of the one matrix portion until two data segments corresponding to the one matrix portion remain; (6) an other portion of the data matrix is appended to the two data segments corresponding to the one matrix portion, and (7) processing is repeated until no matrix portions remain. The remaining two data segments are combined to provide a result.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
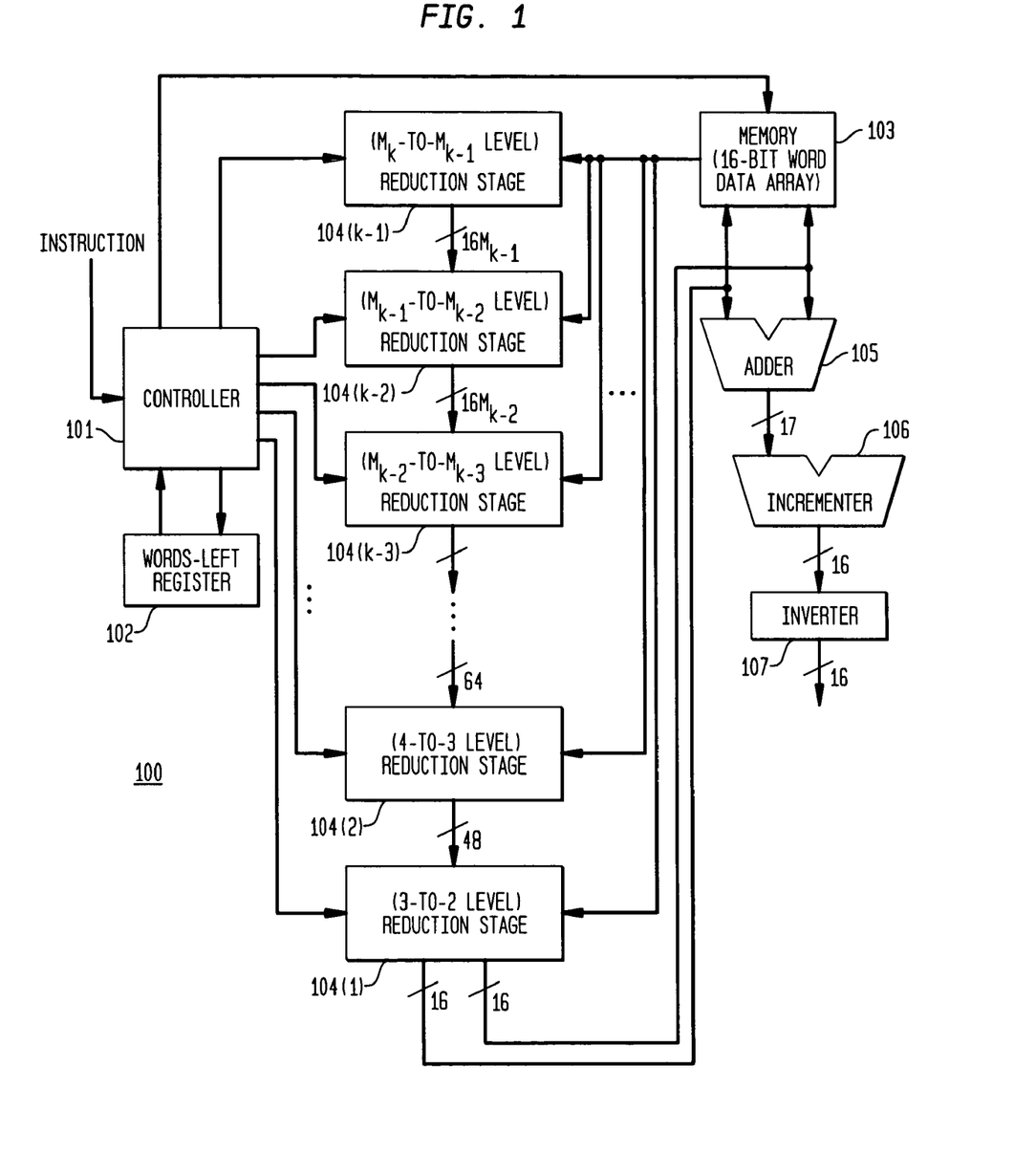
FIG. 1 shows a block diagram of a checksum calculator operating in accordance with an exemplary embodiment of the present invention.

FIG. 1 shows a checksum calculator 100 operating in accordance with an exemplary embodiment of the present invention. Checksum calculator 100 comprises controller 101, words-left register 102, memory 103, reduction stages 104(1) through 104(k−1), adder 105, incrementer 106, and inverter 107. The value of "k" is a positive integer indicating the number of levels employed by checksum calculator 100. The number of levels may be set by a given implementation, and might be equivalent to the number of reduction stages employed to generate the final result of one's-complement addition of the segments of a packet for which the checksum is to be calculated. Segments of the packet are L-bit words stored as rows in a checksum data array, where L is a positive integer, equivalent to the length of the segment.

Controller 101 receives an instruction identifying i) the data for which the checksum is to be calculated and ii) the length of the data. The length of the data might be specified as either the number of bits in the data or as the number of rows, or L-bit words, in the checksum data array. Controller 101 partitions the data into the L-bit words to form the checksum data array, which checksum data array is stored in memory 103. If the number of bits in the data (e.g., sub-packet) is not an integer multiple of the L-bit word size, the final L-bit word comprises the remaining subpacket byte's bits as the most significant bits (MSBs) and zero padding for the remaining bits (the least significant bits, or LSBs).

Rows of the data array from memory 103 corresponding to the L-bit words are provided to one or more of reduction stages 104(1) through 104(k−1), which are employed to process, as described subsequently, groups of rows in the checksum data array until two rows remain. These remaining two rows are provided by reduction stage 104(1) to adder 105, which then combines the remaining two rows. If the addition of the remaining rows generates a result having a carry-bit, the result is incremented by 1 by incrementer 106. Finally, the result (after incrementing, if necessary) is inverted by inverter 107 to generate the complement of the result, which value is provided as the output checksum of the data array.

Figure 2:
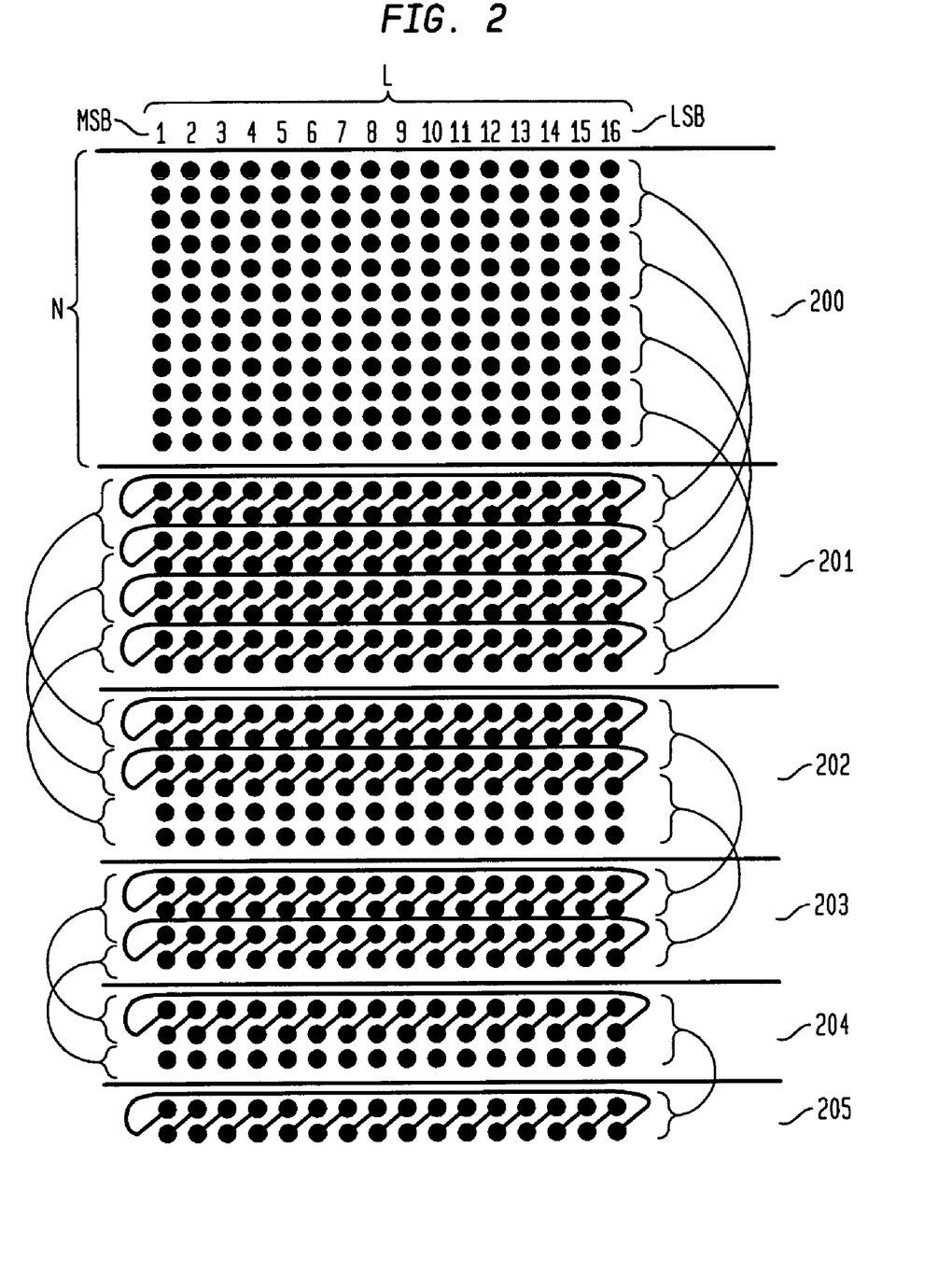
FIG. 2 illustrates a breakdown of a checksum data array when processed by the exemplary embodiment of FIG. 1.

FIG. 2 illustrates a reduction algorithm for the breakdown of a checksum data array such that the array might be processed by the exemplary embodiment of FIG. 1. A matrix 200 is formed from the data (subpacket) such that each row comprises, for example, a 16-bit data word for checksum calculation (L is 16 for this example of FIG. 2). In original matrix 200 stored in, for example, memory 103, the rows are arranged in as many groups of three as possible. Each group of three rows in matrix 200 is processed using, for example, a set of L full adders (FAs), where each 3-bit column set (of the group of three rows) is combined by a corresponding FA to obtain a sum bit and a carry bit. Although not relevant to matrix 200, in general, rows that are not included in the groupings of three rows are not processed and are carried over to the resulting processed matrix.

New matrix 201 is formed such that each sum bit from a column of three rows in the original matrix 200 becomes an entry in the same column in the new matrix 201, and each carry bit from a column in original matrix 200 becomes an entry in the immediately more significant column in the next row of new matrix 201, where left is more significant than right. In general, each group of three rows is reduced to two rows in the new matrix, and, thus, the 12 rows of matrix 200 are reduced to 8 rows in matrix 201. In FIG. 2, each dot to the upper-right of a diagonal dash is the sum bit from an FA for the previous matrix, and each dot to the lower-left of a diagonal dash is the carry bit. To implement one's-complement addition, the carry bits produced from each full adder in the most significant column (i.e., the left-most column) of the original matrix become entries in the least significant column (i.e., the right-most column) of the new matrix.

New matrix 201 is processed in the same way as original matrix 200 to generate matrix 202. Rows not included in the groupings of three rows in the matrix 201 (because the number of rows in the new matrix 201 is not evenly divisible by three) are passed unmodified to the next matrix for processing. Matrix 202 is processed in the same manner as matrices 200 and 201, as are subsequent new matrices 203 and 205 until there are two 16-bit rows remain (shown as matrix 205 in FIG. 2). These rows are added together, and the sum is incremented if the addition overflows. The checksum is computed by inverting this result.

Returning to FIG. 1, each of reduction stages 104(1) through 104(k−1) is designed to reduce N/3 groups of three rows to 2N/3 rows, where N is a positive integer greater than or equal to 3 that is wholly divisible by 3. Each of reduction stages 104(1) through 104(k−1) comprises N groups of L full adders, where L is the length of the datawords in the checksum matrix that is to be processed. As described previously, each full adder combines each 3-bit column set of the group of three rows to obtain a sum bit and carry bit. Thus, for the exemplary checksum calculation of FIG. 2 where L is 16, a reduction stage corresponding to N=12 processes matrix 200; a reduction stage corresponding to N=6 processes matrix 201 (with two rows carried over for subsequent processing); a reduction stage corresponding to N=6 processes matrix 202; and a reduction stage corresponding to N=3 processes matrix 203 (with one row carried over for subsequent processing). That same reduction stage corresponding to N=3 then processes matrix 204. Reduction stage 104(1) of FIG. 1, for example, is a reduction stage corresponding to N=3 that processes a matrix to yield two rows, where one row corresponds to sum-bit values and the other row corresponds to carry-bit values.

For checksum calculator 100 of FIG. 1, if the number of L-bit words in the data matrix is greater than the number that can be processed by the highest reduction stage, a portion of the L-bit words in the data matrix is sent to the highest level reduction stage. The number of segments in the portion is equivalent to the number that can be processed by the highest reduction stage. The number of remaining L-bit words is stored in words-left register 102, which is coupled to controller 101. Dynamically, as long as there is a non-zero value in words-left register 102, the two output words from the lowest-order stage are appended to the remaining L-bit words in the data matrix array, and the circuit is engaged for another iteration, using this as the new data matrix array. If the value in words-left register 102 is zero, then the two output words are added together and any overflow is added to the sum. The result is then inverted to produce the checksum.

Thus, if the number N of data array L-bit words exceeds the maximum number $N_{MAX}$ that the highest level reduction stage can process, the difference $(N-N_{MAX})$ is saved in words-left register 102. In the exemplary implementation described herein, after reduction stages 104(1) through 104 (k−1) process the maximum number $N_{MAX}$ of groups of rows to yield two output words, additional rows are appended to the result, and N is reduced by number of rows appended to the result. The result is again processed by reduction stages 104(1) through 104(k−1). This operation is repeated until the difference in words-left register 102 is zero. This exemplary implementation may be preferred if each of the reduction stages shares its hardware resources (i.e., digital logic circuitry, such as full adder groups) with other reduction stages. In another exemplary implementation, each reduction stage has separate hardware resources. For this implementation, the data array L-bit words are divided into several groups, with the several groups distributed and processed in parallel among the reduction stages. For example, if the number N is 18 and the highest reduction stage $N_{MAX}$ is 12, the data array is separated into two groups, one having 12 rows processed by the highest level reduction stage and the other having 6 rows processed by a lower level reduction stage. The two results are then appended and the process repeated.

Figure 3:
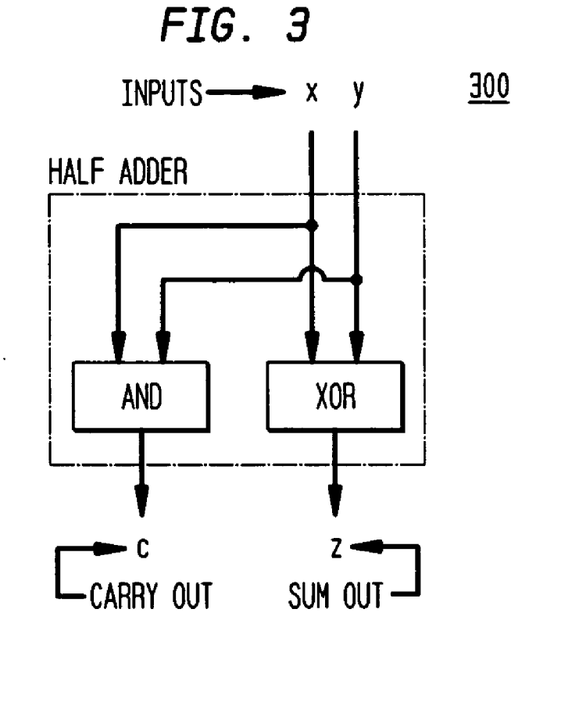
FIG. 3 shows a half adder employed by a full adder as may be employed by the reduction stage of FIG. 1.
Figure 4:
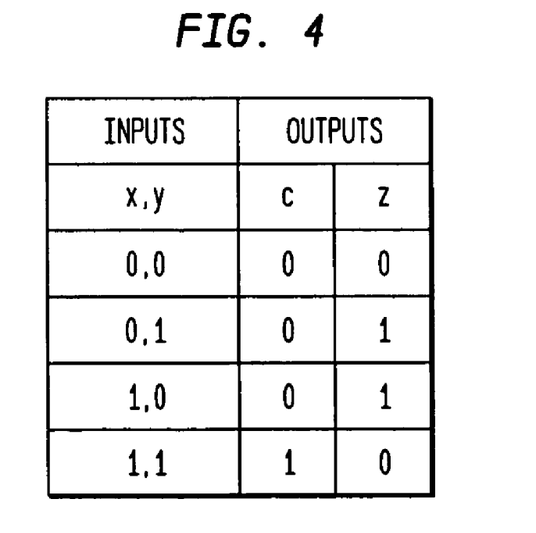
FIG. 4 shows a logic table for the half adder of FIG. 3.
Figure 5:
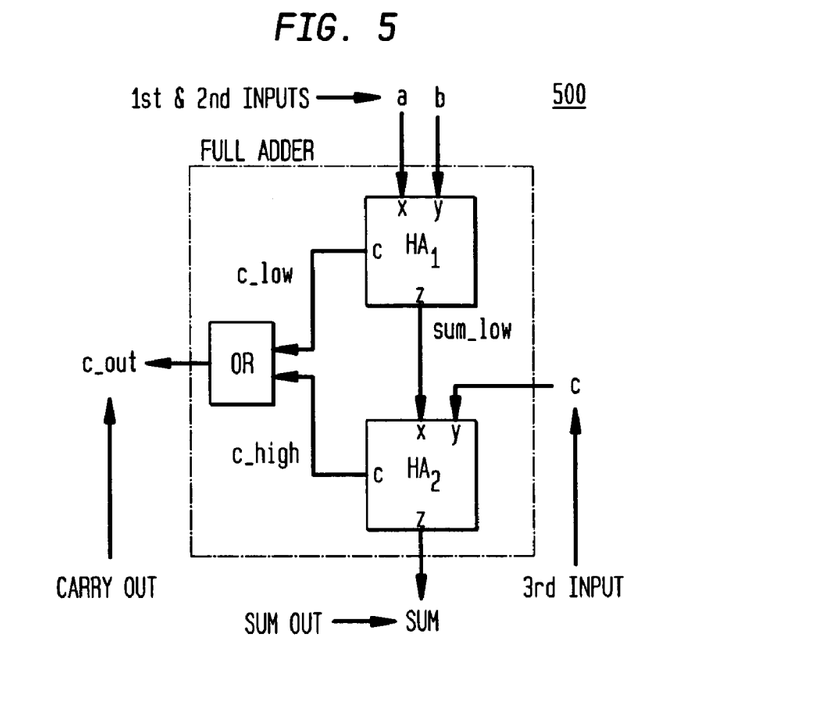
FIG. 5 shows a full adder employed by the checksum calculator as may be employed by the reduction stage of FIG. 1.
Figure 6:
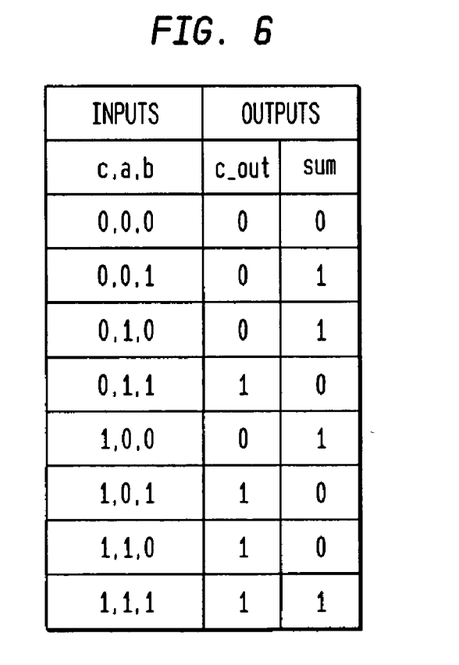
FIG. 6 shows a logic table for the full adder of FIG. 5.

Logic circuits to implement a full adder are well-known in the art, such as the circuits described with respect to FIGS. 3–6. A full adder receives three input bits, and combines the three input bits to generate a sum and a carry bit. A full adder is generally implemented using two half adders. FIG. 3 shows an exemplary half adder 300, and FIG. 4 shows a logic table for the half adder 300 of FIG. 3. Two bits x and y input to the adder are combined by an XOR logic gate to generate a sum z, while the two input bits x and y are combined by a logic AND gate to generate the carry bit c. FIG. 5 shows an exemplary full adder 500 employed by, for example, the checksum calculator of FIG. 1. The full adder 500 of FIG. 5 receives three input bits a, b, and c, and the full adder comprises an OR logic gate and two half adders $HA_1$ and $HA_2$. Half adder $HA_1$ receives two input bits a and b, and generates a sum, sum_low, of the two bits as well as a carry bit, c_low, for the combined input bits a and b. Half adder $HA_2$ receives sum_low and c, and generates a sum, sum_out, of sum_low and c as well as a carry bit, c_high. The output carry bit c_out is generated by the logic OR of carry bits c_low and c_high. FIG. 6 shows a logic table for the full adder of FIG. 5.

Returning to FIG. 1, since all of the full adders in each of reduction stages 104(1) through 104(k−1) might be operated in parallel, the total delay in each of reduction stages 104(1) through 104(k−1) is equivalent to the delay of a single full adder. The total reduction delay associated with this method is approximately $$D_{TOTAL} \approx M_{3\text{-}2\ Stages} * d_{FA}$$

where $D_{TOTAL}$ is the total delay, $M_{3\text{-}2\ stages}$ is the number of stages required to reduce the original matrix to two rows, and $d_{FA}$ is the delay of a full adder. In the described example, the original 12-row matrix is reduced to eight, six, four, three, and finally two levels. If the delay of a full adder is approximately two gate delay periods, the total delay of the checksum computation through the reduction stages is approximately ten gate delay periods.

Reduction stages 104(1) through 104(k−1) of FIG. 1 are configured in a tree structure that may allow for pipeline processing. For example, the checksum data array might be divided into many segments, each of which may be processed by the highest reduction stage. Pipeline processing would provide each segment in succession to the highest reduction stage (e.g., one per clock cycle), allowing for a reduction in processing time to calculate the checksum.

Figure 7:
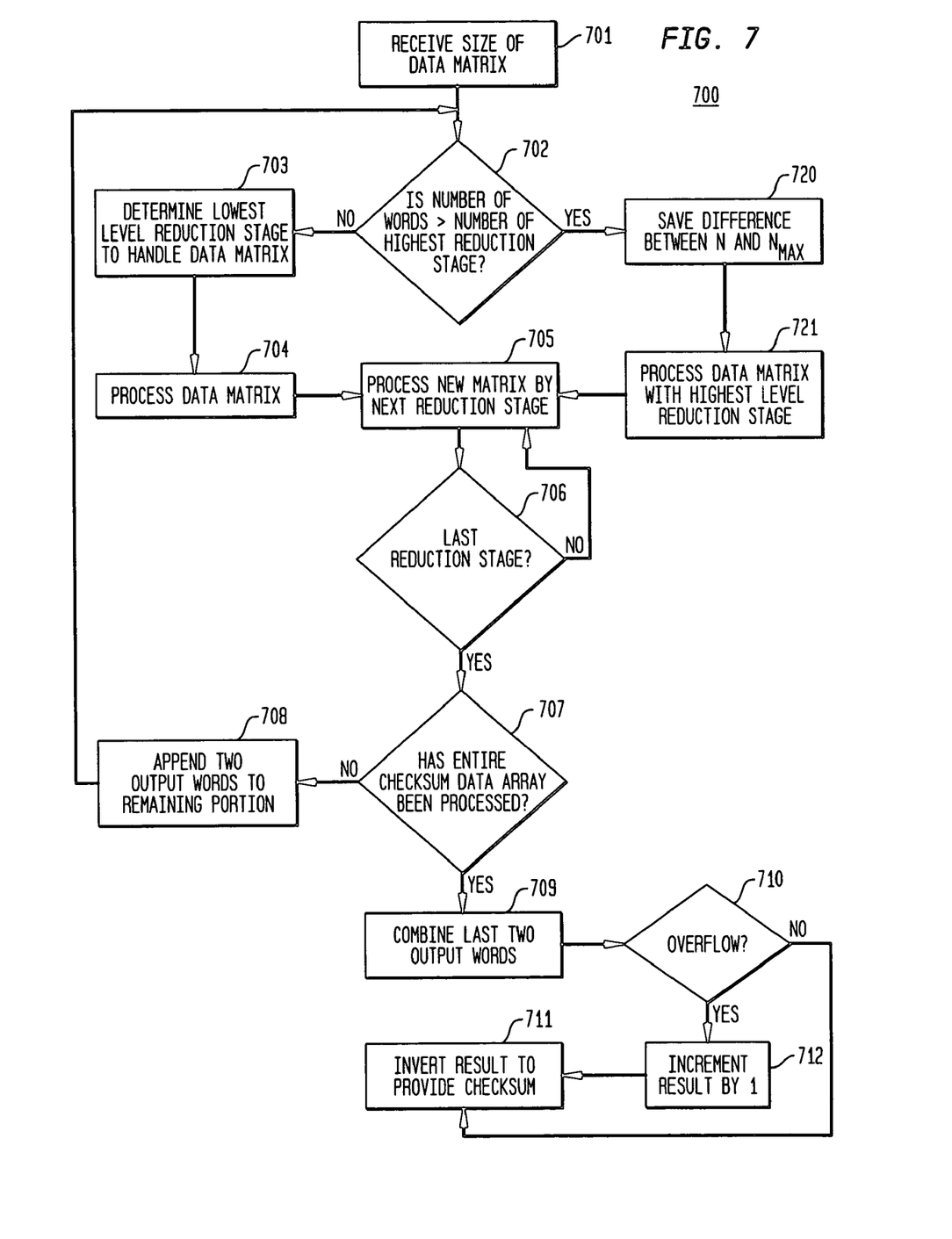
FIG. 7 shows an exemplary method of processing a checksum data array as may be employed by the exemplary embodiment of FIG. 1.

FIG. 7 shows an exemplary method 700 of processing a checksum data array as may be employed by controller 101 of the exemplary embodiment of FIG. 1. At step 701, a checksum instruction provides the size of the data word matrix. The size of the data word matrix includes the total number N of L-bit words in the data word matrix. At step 702, a test determines whether the number N of L-bit words in the data word matrix is greater than the number $N_{MAX}$ of words that the highest reduction stage might process. If the test of step 702 determines that the number of L-bit words is less than or equal to the number $N_{MAX}$ that the highest level reduction stage can handle, at step 703, the lowest level reduction stage that can handle all L-bit words is determined. At step 704, the matrix is processed by the lowest level reduction stage that can handle all L-bit words. From step 704, the method advances to step 705.

If the test of step 702 determines that the number N of L-bit words exceeds the number $N_{MAX}$ that the highest level reduction stage can handle, then, at step 720, the difference is saved (such as, for example, in words-left register 102 of FIG. 1). At step 721, a portion (e.g. $N_{MAX}$) of the data matrix is processed by the highest level reduction stage. From step 721, the method advances to step 705.

At step 705, the new matrix is processed as described previously, by the next reduction stage. Each reduction stage receives either i) the output from the previous stage, ii) a portion of the data word matrix, or iii) all zeroes (if no processing is to occur). Thus, each reduction stage is set to accept the appropriate input, which is determined by which stage the data words are originally sent to. For example, if the data is sent to stage j, then stage j is set to accept the data words, every stage k such that dim(k)<dim(j) is set to accept the output from the previous stage, and every reduction stage m such that dim(m)>dim(j) is set to accept zeroes.

At step 706, a test determines whether the current reduction stage is the last, or smallest, reduction stage. When the smallest stage finishes processing, two output words are provided from the smallest stage. If the test of step 706 determines that the current reduction stage is not the smallest reduction stage, the method returns to step 705 for processing by the next reduction stage. If the test of step 706 determines that the current reduction stage is the smallest reduction stage, at step 707, a test determines whether the entire original checksum data array has been processed (i.e., the difference in the words left register is zero). If the test of step 707 determines that the entire original checksum data array has not been processed, then, at step 708, the two output words from the last reduction stage are appended to the remaining portion of the checksum data array and the method returns to step 702. If the test of step 707 determines that the entire original checksum data array has been processed, then, at step 709, the two output words from the last reduction stage are added together.

At step 709, the addition of the two output words may generate an overflow (e.g., a carry bit). At step 710, a test determines if an overflow has occurred. If the test of step 710 determines that there is an overflow, then, at step 712, the overflow bit is added into the result before the method advances to step 711. If the test of step 710 determines that no overflow has occurred, the method advances to step 711. At step 711, the result is inverted to obtain the checksum.

The present invention may allow for the following advantages. A given implementation in, for example, an integrated circuit (IC) allows for selecting only those portions of a checksum calculator that are required to generate a checksum result for a given checksum data array. Consequently, the given implementation might calculate the checksum result with greater speed/efficiency while requiring less operating power than checksum calculators with fixed circuitry.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented method of verifying a data block using a checksum for the data block calculated by reduction, the method comprising the steps of:
   (a) receiving the data block;
   (b) partitioning the data block into N segments of a data matrix, N being an integer greater than one;
   (c) comparing N to a number of segments processed by each of at least two reduction stages, the at least two reduction stages arranged in a tree structure;
   (d) If N is less than or equal to the number of segments processed by a highest level reduction stage, then:
      (1) processing the data matrix with a lowest level reduction stage that is configured to process the entire data matrix to generate a new data matrix, and
      (2) repeating step (d)(1) for each subsequent new data matrix until two data segments remain;
   otherwise, if N is greater than the number of segments processed by the highest-level reduction stage, then:
      (3) dividing the data matrix into one or more portions;
      (4) processing one matrix portion with the highest-level reduction stage that is configured to process the matrix portion to generate a new data matrix,
      (5) repeating steps (d)(1) and (d)(2) for each subsequent new data matrix of the one matrix portion until two data segments corresponding to the one matrix portion remain,
      (6) appending another portion of the data matrix to the two data segments corresponding to the one matrix portion, and
      (7) repeating step (d) until no matrix portions remain;
   (e) combining the remaining two data segments to provide a checksum result; and
   (f) verifying the integrity of the received data block based on the checksum result.

2. The invention as recited in claim 1, further comprising the step of inverting the checksum result to provide the checksum of the data block.

3. The invention as recited in claim 1, further comprising the step of incrementing the checksum result if the combination of the remaining two data segments overflows.

4. The invention as recited in claim 1, wherein:
   step (d)(3) comprises the step of:
   (i) dividing the data matrix into one or more portions such that the number of segments of each portion correspond to a number of segments processed by one or more of the reduction stages; and
   step (d)(4) processes each matrix portion concurrently, and further comprises the step of:
   (i) appending one or more new data matrices together to form a subsequent data matrix.

5. The invention as recited in claim 1, wherein step (d)(4) comprises the steps of:
   i) processing one matrix portion with the highest level reduction stage that is configured to process the matrix portion to generate the new data matrix;
   ii) repeating step (d)(4)(i) until two matrix segments remain;
   iii) appending one or more segments of an other matrix portion to the two remaining matrix segments;
   iv) repeating steps (d)(4)(i)–(d)(4)(iv) until the two data segments remain.

6. The invention as recited in claim 1, wherein, for step (b), each segment is an L-bit data word.

7. The invention as recited in claim 1, wherein the data block is either a subpacket or a packet.

8. The invention as recited in claim 1, wherein the method is embodied as processing steps in a processor of an integrated circuit.

9. Apparatus for verifying a data block using a checksum for the data block calculated by reduction, the apparatus comprising:
   a processor adapted to coordinate processing of one or more reduction stages;
   at least two reduction stages arranged in a tree structure, each reduction stage configured to process a matrix in accordance with the reduction; and
   a combiner adapted to combine two remaining data segments to provide a checksum result, and
   wherein:
   the apparatus is configured to (i) receive the data block and (ii) verify the received data block based on the checksum result provided by the combiner;
   the processor is configured to compare i) N segments of a data matrix representing the data block to ii) a number of segments processed by each of the at least two reduction stages, N being an integer greater than one, and wherein the processor is configured to coordinate a test of:
   If N is less than or equal to the number of segments processed by a highest level reduction stage, then:
      (1) a lowest level reduction stage that is configured to process the entire data matrix processes the data matrix to generate a new data matrix, and
      (2) each subsequent new data matrix is processed by one or more corresponding reduction stages until the two data segments remain;
   otherwise, if N is greater than the number of segments processed by the highest-level reduction stage, then:
      (3) the processor divides the data matrix into one or more portions;
      (4) the highest-level reduction stage that is configured to process one matrix portion processes the one matrix portion to generate a new data matrix,
      (5) the processor enables repetition of (3) and (4) for each subsequent new data matrix of the one matrix portion until two data segments corresponding to the one matrix portion remain,
      (6) the processor appends another portion of the data matrix to the two data segments corresponding to the one matrix portion, and
      (7) the test is repeated until no matrix portions remain.

10. The invention as recited in claim 9, further comprising an inverter configured to invert the checksum result to provide the checksum of the data block.

11. The invention as recited in claim 9, further comprising logic configured to increment the checksum result if the combination, by the combiner, of the remaining two data segments overflows.

12. The invention as recited in claim 9, wherein each segment is an L-bit data word.

13. The invention as recited in claim 9, wherein the data block is either a subpacket or a packet.

14. The invention as recited in claim 9, wherein the apparatus is embodied in a circuit.

15. The invention as recited in claim 9, wherein the circuit is embodied in an integrated circuit.

16. A computer-readable medium having stored thereon a plurality of instructions, the plurality of instructions including instructions which, when executed by a processor, cause the processor to implement a method for verifying a data block using a checksum for the data block calculated by reduction, the method comprising the steps of:

(a) receiving the data block;

(b) partitioning the data block into N segments of a data matrix, N being an integer greater than one;

(c) comparing N to a number of segments processed by each of at least two reduction stages, the at least two reduction stages arranged in a tree structure;

(d) If N is less than or equal to the number of segments processed by a highest level reduction stage, then:
 (1) processing the data matrix with a lowest level reduction stage that is configured to process the entire data matrix to generate a new data matrix, and
 (2) repeating step (d)(1) for each subsequent new data matrix until two data segments remain;

otherwise, if N is greater than the number of segments processed by the highest-level reduction stage, then:
 (3) dividing the data matrix into one or more portions;
 (4) processing one matrix portion with the highest-level reduction stage that is configured to process the matrix portion to generate a new data matrix,
 (5) repeating steps (d)(1) and (d)(2) for each subsequent new data matrix of the one matrix portion until two data segments corresponding to the one matrix portion remain,
 (6) appending another portion of the data matrix to the two data segments corresponding to the one matrix portion, and
 (7) repeating step (d) until no matrix portions remain;

(e) combining the remaining two data segments to provide a checksum result; and (f) verifying the integrity of the received data block based on the checksum result.

* * * * *